(12) United States Patent
Brummel

(10) Patent No.: US 6,678,853 B1
(45) Date of Patent: Jan. 13, 2004

(54) METHOD AND APPARATUS FOR GENERATING RANDOM CODE

(75) Inventor: Karl P Brummel, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/466,503

(22) Filed: Dec. 17, 1999

(51) Int. Cl.⁷ .............................................. G01R 31/28
(52) U.S. Cl. ...................................... 714/739; 714/738
(58) Field of Search ........................... 395/500.06, 702; 706/25; 714/739, 33, 728, 724, 730, 738

(56) References Cited

U.S. PATENT DOCUMENTS

| | | | |
|---|---|---|---|
| 4,688,223 A | * 8/1987 | Motika et al. ............... | 714/728 |
| 4,801,870 A | * 1/1989 | Eichelberger et al. ...... | 714/736 |
| 5,455,891 A | * 10/1995 | Hirotsu et al. ................. | 706/25 |
| 5,455,938 A | * 10/1995 | Ahmed ................... | 395/500.06 |
| 5,485,471 A | * 1/1996 | Bershteyn .................... | 714/739 |
| 5,729,554 A | * 3/1998 | Weir et al. ................... | 714/739 |
| 5,771,241 A | 6/1998 | Brummel .................... | 371/22.5 |
| 5,784,550 A | * 7/1998 | Brockmann et al. .......... | 714/33 |
| 5,859,999 A | 1/1999 | Morris et al. ............... | 395/565 |
| 5,860,017 A | 1/1999 | Sharangpani et al. .. | 395/800.23 |
| 5,913,064 A | * 6/1999 | Chen .......................... | 395/702 |

OTHER PUBLICATIONS

Wolfe, A., "Patents shed light on Merced's Innards", Electronic Engineering Times, Feb. 15, 1999.

* cited by examiner

Primary Examiner—David Ton

(57) ABSTRACT

A method and apparatus produce random computer code for testing integrated circuit. The method begins by generating a random weight for an instruction type, and then generating randomly determined computer code. A statistical likelihood of generating the instruction type in the code is based on the random weight for the generated instruction type. The apparatus includes a random value generator that generates a random weight and a random code generator that is connected to the random value generator. The random code generator produces an output file in which the proportion of at least one computer instruction type is related to the random weight produced by the random value generator.

21 Claims, 3 Drawing Sheets

METHOD AND APPARATUS FOR GENERATING RANDOM CODE

TECHNICAL FIELD

The invention relates generally to random code generation for testing the operation of an integrated circuit design and, more particularly, to a system for improving the ability of a random test generator to produce effective test cases by controlling the randomness of the generated test code through the addition of a further level of user controlled randomness.

BACKGROUND OF THE INVENTION

In verifying microprocessors, random code generators, also called random generators, are used frequently. (The use of the term "random" herein is intended to include the cases of pseudo-random random and truly random.) Random code generators offer the advantage of producing code for test cases much faster than a human can write them by hand, and they can be steered around known problems more easily than adapting existing hand written code. Random code generators can also generate a staggering variety of test cases by randomizing the initial state, the instruction mix, and many other parameters.

In order to generate code, the user supplies the random code generator with some parameters, typically a set of probabilities and a random seed, along with other miscellaneous information such as how many codesets to generate, how long to make each codeset, etc.

Random code generators are typically controlled with a probability file, or control file, which typically contains a list of parameters and values. Such parameters typically control the distribution of instructions (e.g., loads, stores, adds, etc.) and the probability of other events (like initializing data in a cache). By adjusting the settings in the control file, the generator can be steered into specific areas of the test space, or steered away from certain areas of the test space.

For example, if the probability file consists of the following parameters and settings:

| | |
|---|---|
| load | 25 |
| store | 25 |
| add | 25 |
| branch | 25 |

The generator might, if asked to generate a case with 100 instructions, generate 25 loads, 25 stores, 25 adds, and 25 branches. The instructions may be in any mixture; only the approximate relative likelihoods of each kind of instruction is specified.

By setting the "Load" parameter to 0, the user can prevent the generation of load instructions altogether, enabling testing of a microprocessor on which loads are known to be a problem. This is a very desirable feature for a variety of reasons. First, the user can focus on specific areas known to be at risk. Second, if testing multiple prototypes of a processor, each prototype may have different characteristics electrically. For example, one may have a problem where the processor cannot execute loads at a certain clock frequency, or another processor may execute loads but be incapable of performing adds. The control file allows users to generate specific cases for specific circumstances.

One of the important tradeoffs in designing and implementing a random code generator is determining how much control to give the user over the generator. While the ability to steer a generator into or away from a certain part of the test space is invaluable, it does not come without some conflicts. On one hand, the user wants enough control to be able to steer the generator into some parts of the test space, or steer it away from some parts of the test space (to avoid known difficulties). On the other hand, the user would like to generate a significant variety of cases from a specific control file. As a result, some random code generators have few or no controls, and other code generators have many control parameters to enable careful steering. However, having a large number of control parameters leads to the control files becoming unwieldy and difficult to use simply because of the sheer number of controls. Another even more difficult problem is that with a large number of parameters, the control file often essentially completely describes the test cases it produces, effectively leaving little randomness remaining in the test cases.

A generator with few or no controls tends to require modifications (e.g., source code changes) to the code generator to work around problems encountered in the test cases, or they focus on a particular part of the test space to the exclusion of others. This becomes problematic when several users may need slightly different versions of the code generator, which creates a lot of work for the person developing and maintaining the random code generators.

Long control files also create difficulties. First, such control files are unwieldy and can become difficult for a casual user to write. Second, a long and detailed control file can place so much constraint on the resulting test cases that all codesets arising from a given set of controls look essentially alike. This in turn means that such a control file is only useful to generate a few cases from a given set of controls. And this in turn means users must generate many unique control files for all of their tests. Since control files can be unwieldy and time consuming to write completely by hand, practitioners in the art have generally used computer programs to generate control files, including the use of random code generators to generate completely random control files. However, these machine-generated control files often produce cases of dubious quality because it is difficult to maintain useful correlations between a large number of controls.

Further background on random code generation can be found in U.S. Pat. No. 5,729,554, Weir et al.; U.S. Pat. No. 5,771,241, Brummel; and U.S. Pat. No. 5,784,550, Brockmann et al., each of which is incorporated herein by reference.

SUMMARY OF THE INVENTION

In one respect, the invention describes a method of producing random computer code. The method comprises the steps of generating a random weight for an instruction type, and then generating randomly determined computer code wherein a statistical likelihood of generating the instruction type in the code is based on the random weight for the generated instruction type.

In another respect, the invention is an apparatus for use in producing random computer code consisting of code instructions. The apparatus comprises a random value generator and a random code generator that is connected to the random value generator. The random code generator produces an output file in which the proportion of at least one computer instruction type is related to a random number produced by the random value generator.

In yet another respect, the invention is a form of computer software embedded on a computer readable medium. The software includes the instructions necessary to perform the steps of generating a random weighting factor for a predetermined instruction type, and to generate computer code randomly in approximate proportion by instruction type to its assigned weighting factor.

In comparison to random code generators using purely predetermined control parameters or random code generators using purely random control parameters, certain embodiments of the present invention are capable of achieving certain advantages, including the following:

(1) The ability to generate a large variety of codesets from a single control file;

(2) The ability to generate a large variety of codesets using a small set of control types;

(3) The ability to effectively and precisely steer a code generator if desired; and (4) The combined advantages of large code variety and precise steerability together.

Those skilled in the art will appreciate these and other advantages and benefits of various embodiments of the invention upon reading the following detailed description of a preferred embodiment with reference to the drawings listed below.

BRIEF DESCRIPTION OF THE DRAWINGS

An illustrative embodiment of the invention is illustrated in the drawings in which.

DETAILED DESCRIPTION OF A PREFERRED EMBODIMENT

Figure 1:
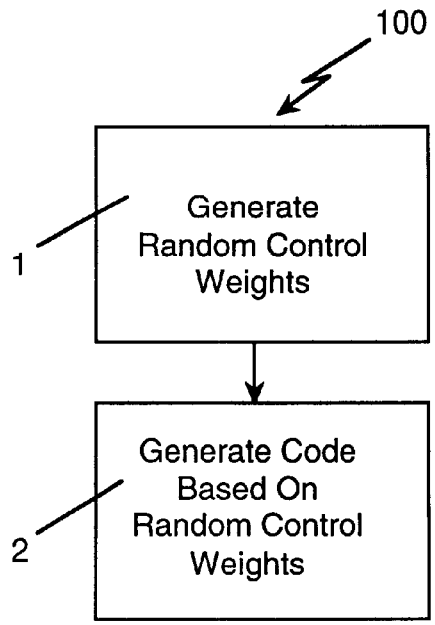
FIG. 1 is a simplified flowchart of a method according to one embodiment of the invention.

FIG. 1 is a simplified flowchart of a method 100 according to one embodiment of the invention. The method 100 controls randomness in generating random code whereby selected control values may be randomized during generation rather than specified prior to generation of the random code. The method 100 consists, in its most basic form, of two steps. First, random weights are generated (1) for predetermined control values; and second, random code is generated (2) based, at least in part, on the generated random weights. The random code is generated by executing a random value generation subroutine and then using the resulting random value to select a code instruction and an instruction value (or operand) and outputs a line of random code. The use of a random value generator, in general, is well known to those skilled in the art. In a preferred embodiment of the invention, the random values, i.e., random weights, are generated by taking the quotient of two double precision random numbers.

Figure 2:
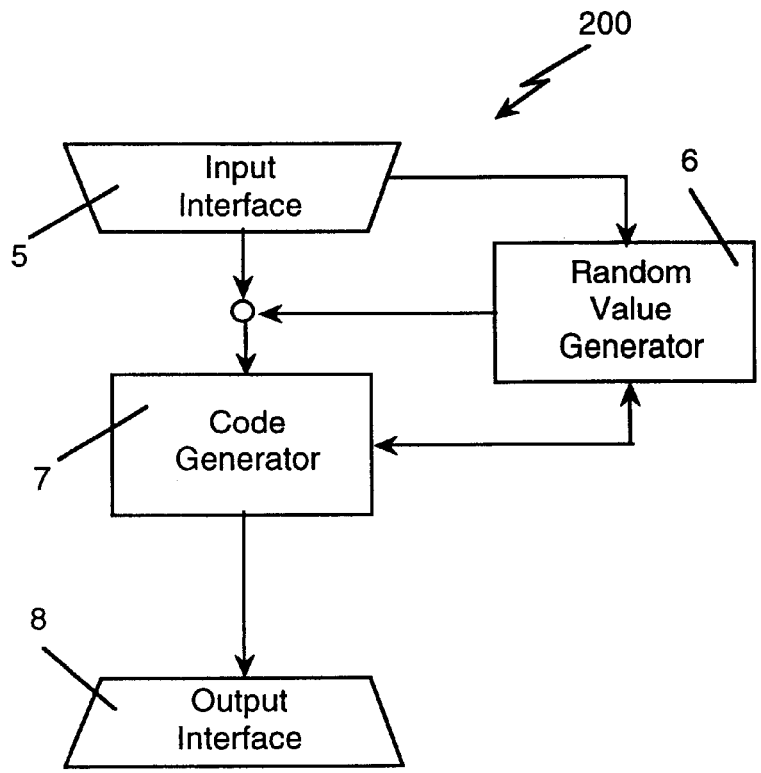
FIG. 2 is a simplified block diagram of an apparatus according to one embodiment of the invention.

FIG. 2 is a simplified block diagram of an apparatus 200 according to one embodiment of the invention. The apparatus 200 is, in its most basic form, comprised of the following elements. An input interface 5 is connected to a random value generator 6, which is in turn interconnected to a code generator 7. Control pairs are read from the input interface 5 and passed on to the random value generator 6 if the control pair calls for the random generation of a weight.

The following is a simple list of five sample control pairs:

| | |
|---|---|
| load | 20 |
| store | 20 |
| add | −1 |
| branch | −1 |
| divide | 0 |

The first entry of each control pair is a control type and the second entry is a control value, generally. In this case, the control types are instruction types and the control values are related to the probability parameters to be used in randomly generating the listed instruction types in the output codeset.

The randomly generated weights (which are triggered by a probability parameter equal to −1 in the list above) are then passed from the random value generator 6 to the code generator 7 for the generation of random code. In a preferred embodiment of the invention, the random value generator 6 forms a random weight by taking the quotient of two double precision random numbers. This increases the variance of the random value generator 6.

The input interface 5 is also connected directly to the code generator 7. If a control pair, as read by the input interface 5, does not call for random weight generation, the control pair is passed on to the code generator 7 directly from the input interface 5. Using the input control pairs, the random code generator then generates multiple lines of random code according to the process discussed above for the method 100. Finally, an output interface 8 is connected to the code generator 7, and the output lines of random code are passed from the code generator 7 to the output interface 8.

The input interface 5 may involve one or more of a file interface, keyboard or other user interface, modem or other data communications interface, etc. The output interface 8 can be a file interface, video screen or other user interface, modem or other data communications interface, etc.

According to one embodiment of the invention, the output lines of random code from the output interface 8 can be in the form of object code, assembly code, source code, or other forms of computer operating code. The output random code can be executed on a processor (including, for example, a microprocessor), a simulation running a model of a processor or microprocessor, or other means for executing code.

Figure 3:
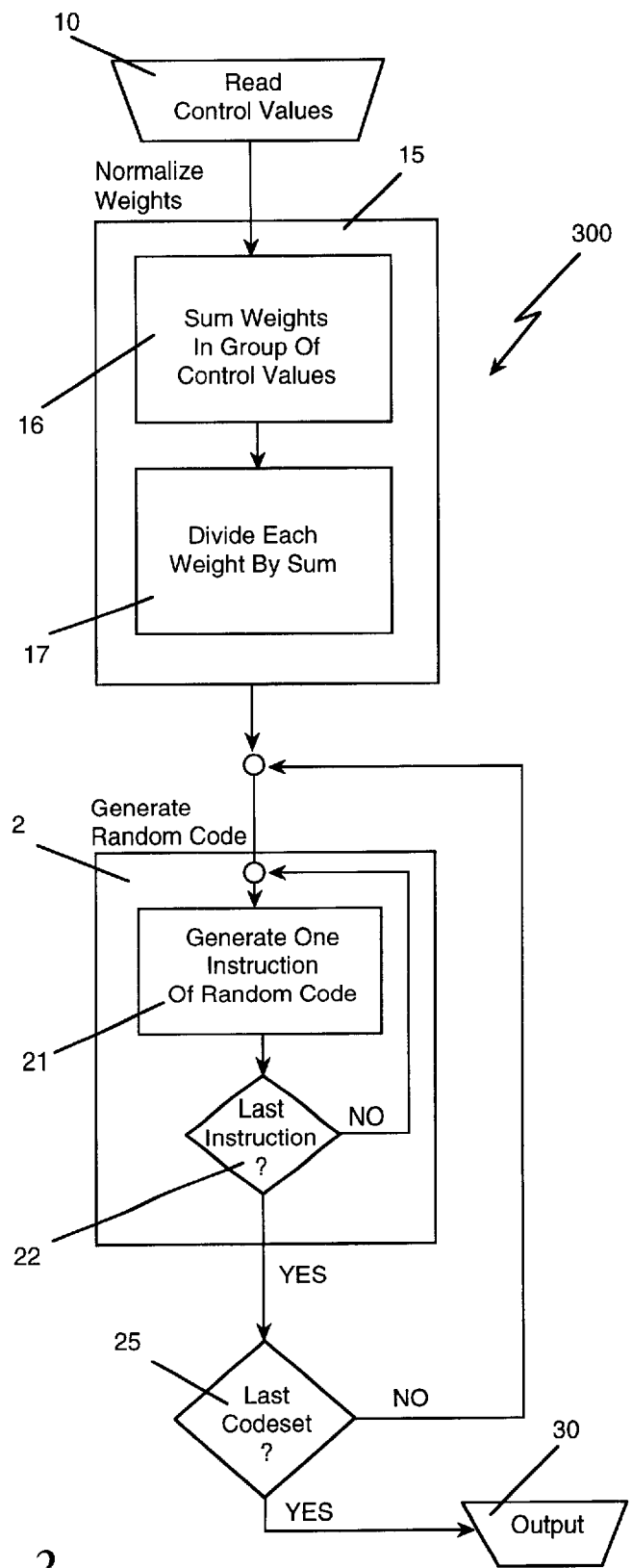
FIG. 3 is a flowchart of a code generation method without random weighting.

FIG. 3 is a flowchart of a code generation method 300 that does not utilize random weighting. This method 300 generally begins when controls are read (10) in order to set the parameters for the random code to be generated. Each control pair that is read contains a control type and a control value as described above in relation to the apparatus 200. In a preferred embodiment, each control type corresponds to a type of instruction to be generated in the output random code, and each control value relates to a weight to assign to that instruction type in the generation of the random code. In order to normalize (15) the weights in a group of control pairs, all of the weights in the group of control pairs is summed (16), and then each weight is divided (17) by the sum.

After normalizing (15) the weights, the control pairs are processed to generate (2) random code using the weights in each control pair to determine the relative proportion of each control type or instruction type to the other control or instruction types as they are generated. That is, the normalized weight for a given instruction type is the probability that a randomly generated line, i.e., instruction, in a codeset will be of that instruction type.

The random code is preferably generated (21) one instruction at a time, and a test is preformed (22) to see if the instruction just generated is the last instruction in the codeset generated on this pass. If it is the last instruction, then another test is performed (25) to determine if the codeset generated is the last codeset. If it is not the last codeset, then the method 300 returns to the beginning of the step of generating random code (2). If the codeset generated is the last codeset desired, then the random code generated is output (30) from the method of the invention, and the method 300 ends. Alternatively, each instruction or codeset can be output individually before the test (25) is performed, or at some other point in the step of generating random code (2), such as prior to the test (22).

Figure 4:
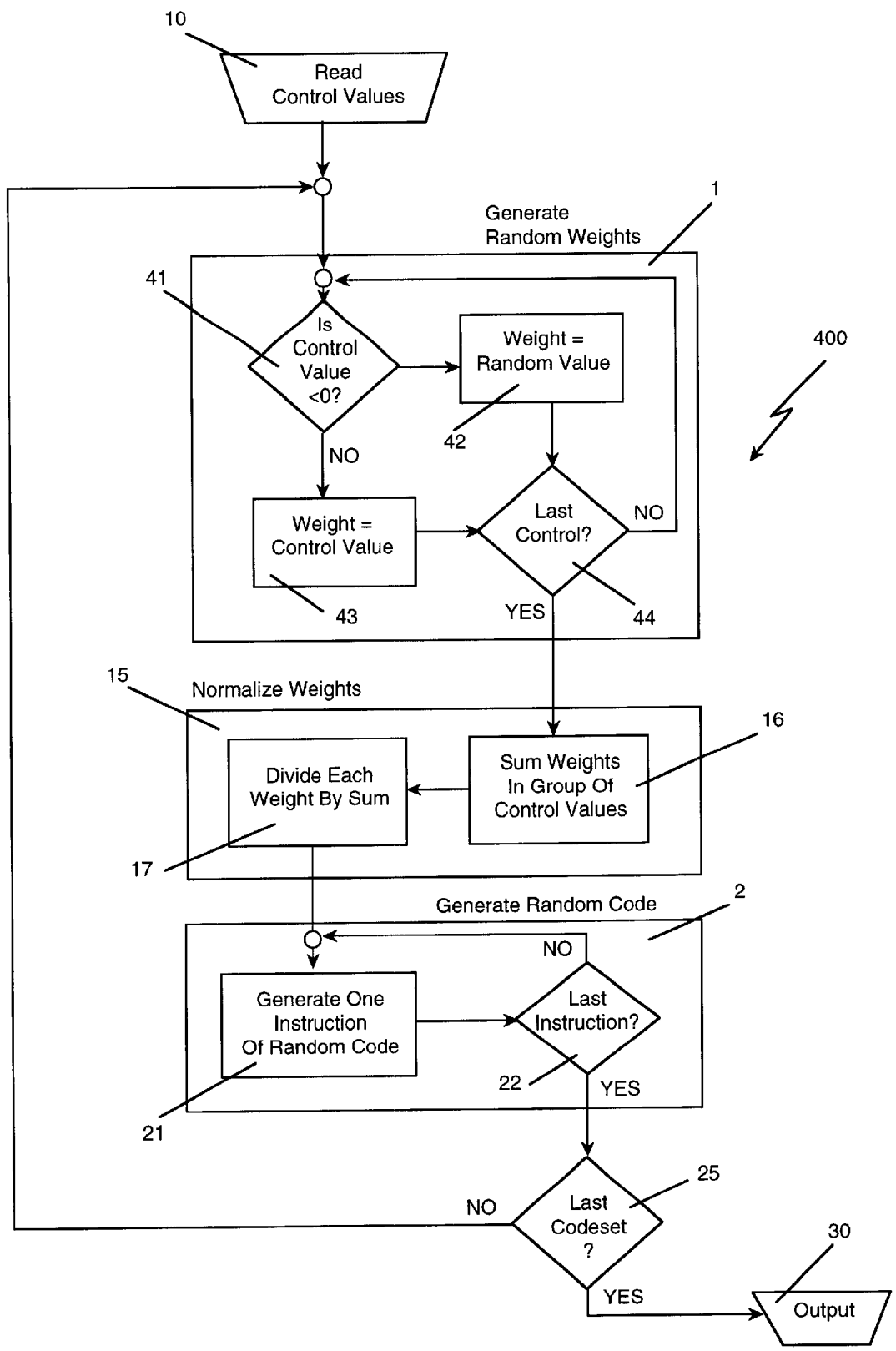
FIG. 4 is a flowchart of a method with random weighting according to one embodiment of the invention.

FIG. 4 is a flowchart of a method 400 with random weighting according to one embodiment of the invention. Generally, three overall steps are performed: generate random control weights (1), normalize weights (15), and generate random code (2). Preferably, the method 400 begins when controls are read (10) in order to set the parameters for the random code to be generated, just as in the method 300.

The control value in each control pair is tested (41) to determine whether it is a positive or negative number. If the control value is a negative number, a random number is generated and assigned (42) as a weight. If the control value is a positive number, the weight for the corresponding control is set (43) equal to the control value. By this process, the user may predetermine the weighted frequency of each control type to be used to generate the random code, or may designate that the weighted frequency of that control type is to be determined randomly. This permits a greater variety and a higher level of randomness to the code generated. Although the method 400 uses negative numbers to indicate that a given weight or control value should be randomized, any other indicator flag, such as, e.g., special characters, would work equally well in place of a negative number. If the control pair being tested and set is the last control pair to be processed (44), then a step of normalizing (15) the weights is performed.

The method 400 proceeds with the normalizing step 15 as described in method 300. After normalizing the weights, the control pairs are processed to generate random code (2) as described for method 300.

The random code can be generated one instruction at a time, as in method 300, and both the last instruction test (22) and the last codeset test (25) are performed as described for method 300. However, if the codeset generated on each pass is not the last codeset, then the process returns to the step of generating random weights (1). By doing so, the random weights used for generating each codeset are approximately statistically independent from each other. The statistical independence is approximate to the extent that there may be imperfections in the random value generation. If the codeset generated is the last codeset desired, then the random code generated is output (30), and the method 400 ends. Alternatively, each instruction or codeset can be output individually before the test (25) is performed, or at some other point in the step of generating random code (2), such as prior to the test (22).

Each of the components of the apparatus 200 can be hardware circuits or, preferably, software programs, modules or scripts (or some combination of hardware and software). Likewise, the steps of the methods 100, 300 and 400 can each be implemented with hardware or by execution of programs, modules or scripts. The programs, modules or scripts can be stored or embodied on one or more computer readable mediums in a variety of formats, such as source code or executable code, for example. The computer readable mediums may include, for example, both storage devices and signals. Exemplary computer readable storage devices include conventional computer system RAM (random access memory), ROM (read only memory), EPROM (erasable, programmable ROM), EEPROM (electrically erasable, programmable ROM), and magnetic or optical disks or tapes. Exemplary computer readable signals, whether modulated using a carrier or not, are signals that a computer system hosting or running the invention can be configured to access, including signals downloaded through the Internet or other networks.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A method of producing random code, the code comprising instructions, the method comprising:
    generating a random weight for an instruction type; and
    generating code randomly wherein a statistical likelihood of generating the instruction type in the code is based on said random weight of the generated instruction type.

2. The method of claim 1 further comprising:
    accepting a plurality of control pairs of control types and control values.

3. The method of claim 2 wherein a control value is selected from the group consisting of a weight and an indicator for random weighting.

4. The method of claim 3 wherein the weight is a nonnegative number.

5. The method of claim 3 wherein the indicator for random weighting is a negative number.

6. The method of claim 2 wherein the control type is an instruction type.

7. The method of claim 1 wherein the step of generating a random weight comprises:
    generating two random numbers; and
    calculating the random weight as the quotient of the two random numbers.

8. The method of claim 1 further comprising:
    executing the random code on a processor.

9. The method of claim 1 further comprising:
    simulating execution of the random code on a processor model.

10. The method of claim 1 wherein the generated random code is object code.

11. The method of claim 1 wherein the generated random code comprises a plurality of codesets, each codeset comprising a plurality of randomly selected instructions.

12. The method of claim 11 wherein each codeset is generated based on a random weight that is approximately statistically independent of other random weights.

13. An apparatus for use in producing random code, the code comprising instructions, the apparatus comprising:
    a random value generator that generates a random weight by generating two random numbers, and calculating the random weight as the quotient of the two random numbers; and
    a code generator, connected to the random value generator, the code generator producing a code output file in which the proportion of at least one instruction type is related to the random weight by the random value generator.

14. The apparatus of claim 13 further comprising:
an input interface, connected to the code generator, by which control types and control values are input.

15. The apparatus of claim 14 further comprising:
an input control file on a computer readable medium that contains the control types and the control values.

16. Computer software embedded on a computer readable medium, the computer software comprising instructions for performing the following steps:
generating a random weighting factor for a predetermined instruction type; and
generating code randomly in approximate proportion by instruction type to a set of respective weighting factors including the random weighting factor.

17. The computer software of claim 16 wherein the instructions for performing the step of generating code randomly comprises:
randomly generating a single line of code, wherein the probability of the single line being of the predetermined instruction type is based on the random weighting factor; and
repeating the previous step a number of times.

18. The computer software of claim 16 wherein the randomly generated code comprises a plurality of codesets, each codeset comprising a plurality of randomly selected instructions.

19. The computer software of claim 18 wherein a different set of weighting factors is used for generating each codeset.

20. The computer software of claim 16 wherein the randomly generated code comprises instructions and operands.

21. A method for producing random code, comprising:
generating a random weight for an instruction type, wherein the random code comprises a plurality of instruction types, and wherein generating the random weight comprises:
determining a quotient of two double precision random numbers, and
normalizing the quotient; and
generating the random code, comprising generating one or more of the plurality of instruction types, wherein a statistical likelihood of generating the instruction type is based on the generated random weight.

* * * * *